(12) United States Patent
Kondou

(10) Patent No.: US 6,657,910 B2
(45) Date of Patent: Dec. 2, 2003

(54) SEMICONDUCTOR DEVICE HAVING INTERNAL POWER TERMINALS INCLUDING A POSITIVE POWER TERMINAL AND A NEGATIVE POWER TERMINAL

(75) Inventor: Keiichirou Kondou, Kawasaki (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 10/265,261

(22) Filed: Oct. 7, 2002

(65) Prior Publication Data

US 2003/0067066 A1 Apr. 10, 2003

(30) Foreign Application Priority Data

Oct. 10, 2001 (JP) .................................. 2001-312543

(51) Int. Cl.⁷ .................................................. G11C 7/00
(52) U.S. Cl. ............................................ 365/226; 365/63
(58) Field of Search ................................... 365/226, 63

(56) References Cited

U.S. PATENT DOCUMENTS 5,483,490 A * 1/1996 Iwai et al. .................. 365/200
5,881,014 A * 3/1999 Ooishi ........................ 365/226
6,411,543 B2 * 6/2002 Narui et al. ................. 365/149

FOREIGN PATENT DOCUMENTS

JP 6-93062 11/1994

* cited by examiner

Primary Examiner—Richard Elms
Assistant Examiner—Tuan T. Nguyen
(74) Attorney, Agent, or Firm—Young & Thompson

(57) ABSTRACT

A semiconductor device having internal power terminals including a positive power terminal supplying a high potential and a negative power terminal supplying a low potential to the internal device region of a semiconductor chip in which the positive power terminal and the negative power terminal are arranged uniformly in the internal device region of the semiconductor chip and power is supplied from the outside of the semiconductor chip to the internal power terminal, wherein a metalizing metal of the same layer as the internal power terminal is wired between the internal power terminals in a tandem shape so as to be connected to the internal power terminal of the same.

4 Claims, 23 Drawing Sheets

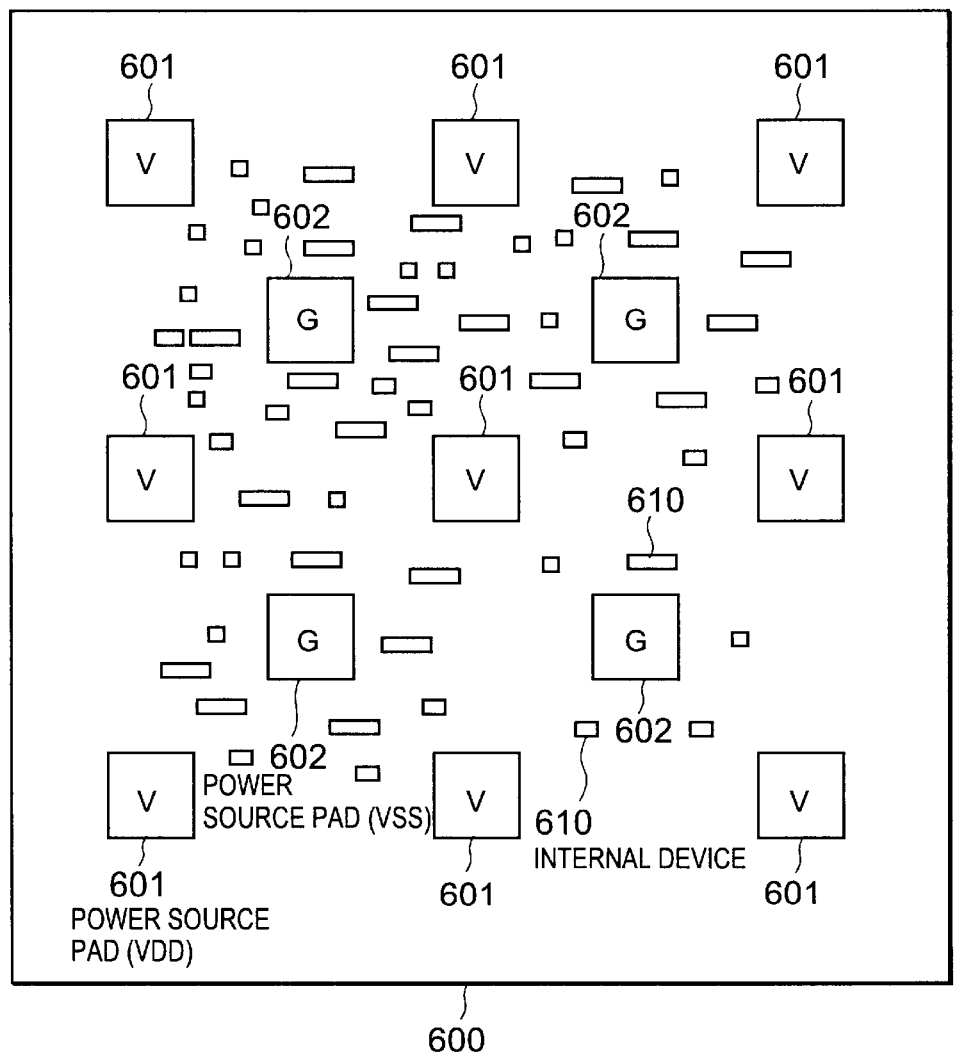

| | PRIOR ART | THIS INVENTION | IMPROVEMENT PERCENTAGE |
|---|---|---|---|
| VDD POWER SOURCE | 9.189mV | 7.622mV | 17.0% |
| VSS POWER SOURCE | 8.140mV | 7.371mV | 9.4% |

SEMICONDUCTOR DEVICE HAVING INTERNAL POWER TERMINALS INCLUDING A POSITIVE POWER TERMINAL AND A NEGATIVE POWER TERMINAL

BACKGROUND OF THE INVENTION

1. Field of the Invention

The present invention relates to a semiconductor device. More specifically, the present invention relates to a semiconductor device having internal power terminals including a positive power terminal supplying a high potential and a negative power terminal supplying a low potential to the internal device region of a semiconductor chip.

2. Description of the Prior Art

The recent advanced semiconductor microfabrication technique can fabricate high-speed and highly integrated semiconductor chips to make a plurality of chips into a single chip.

It is known that in prior art QFP and PGA packages of such single chip technique, the number of signal terminals is increased due to the single chip so that the number of signal terminals is not sufficient.

It is also known that attention is focusing on flip chip packages in which the number of signal terminals can be large.

The flip chip package can increase the number of signal terminals. It has an intermediate substrate called a buildup substrate connecting a package and a semiconductor chip, which can be provided with a power plane.

The intermediate substrate is provided with the power plane to supply power to an arbitrary location in the semiconductor chip, increasing the power supply ability into the semiconductor chip.

When the power plane of the intermediate substrate supplies power into the semiconductor chip, as shown in the cross-sectional view (FIG. 24) of the A–B broken line of FIG. 23 as an example of a prior art semiconductor chip, the power is supplied in one direction from the top side of the semiconductor chip to an internal device 2810 on a silicon wafer 2850.

Such prior art is disclosed in Japanese Published Unexamined Patent Application No. Hei 06-093062.

In the prior art, however, power is supplied to the internal device arranged between power supply points via the multi-layer internal power wires. When the power wiring impedance for each of the wiring layers is high, a source voltage drop (IR-Drop) occurs.

Accordingly, the present invention has been contrived to realize a structure in which one metal layer of the same layer as an internal power source PAD is provided between the power sources PAD to increase the number of power supply points to an under-layer metal, vertically supplying power from the power supply points.

The semiconductor device described in Japanese Published Unexamined Patent Application No. Hei 06-093062 as another prior art has a tandem electrode structure, as in the present invention. It does not focus on a source voltage drop. The power wiring width is not varied corresponding to internal power consumption. The objects and effects thereof are different from those of the present invention.

BRIEF SUMMARY OF THE INVENTION

Summary of the Invention

A semiconductor device having internal power terminal including a positive power terminal supplying a high potential and a negative power terminal supplying a low potential to the internal device region of a semiconductor chip in which the positive power terminal and the negative power terminal are arranged uniformly in the internal device region of the semiconductor chip and power is supplied from the outside of the semiconductor chip to the internal power terminal, wherein a metalizing metal of the same layer as the internal power terminal is wired between the internal power terminals in a tandem shape so as to be connected to the internal power terminal of the same potential, a top and under layer connection VIA is provided in the position where the tandem metalizing metal wire and an under layer metalizing metal cross so as to supply power to the power wire of the internal device region made of the under layer metalizing metal, and only one metalizing metal layer of the same layer as a power source PAD supplying power from a package of the outside of the semiconductor chip to the internal device region of the semiconductor chip is used to lay the internal power wire between the power sources PAD, thereby supplying power to an internal device.

BRIEF DESCRIPTION OF THE DRAWINGS

The above-mentioned and other objects, features and advantages of this invention will become more apparent by reference to the following detailed description of the invention taken in conjunction with the accompanying drawings, wherein:

FIG. 5 is a power consumption file example by internal device of the semiconductor device of the first embodiment of the present invention;

FIG. 6 is a diagram in the course of a first process of the semiconductor device of the first embodiment of the present invention;

DETAILED DESCRIPTION OF THE INVENTION

Figure 1:
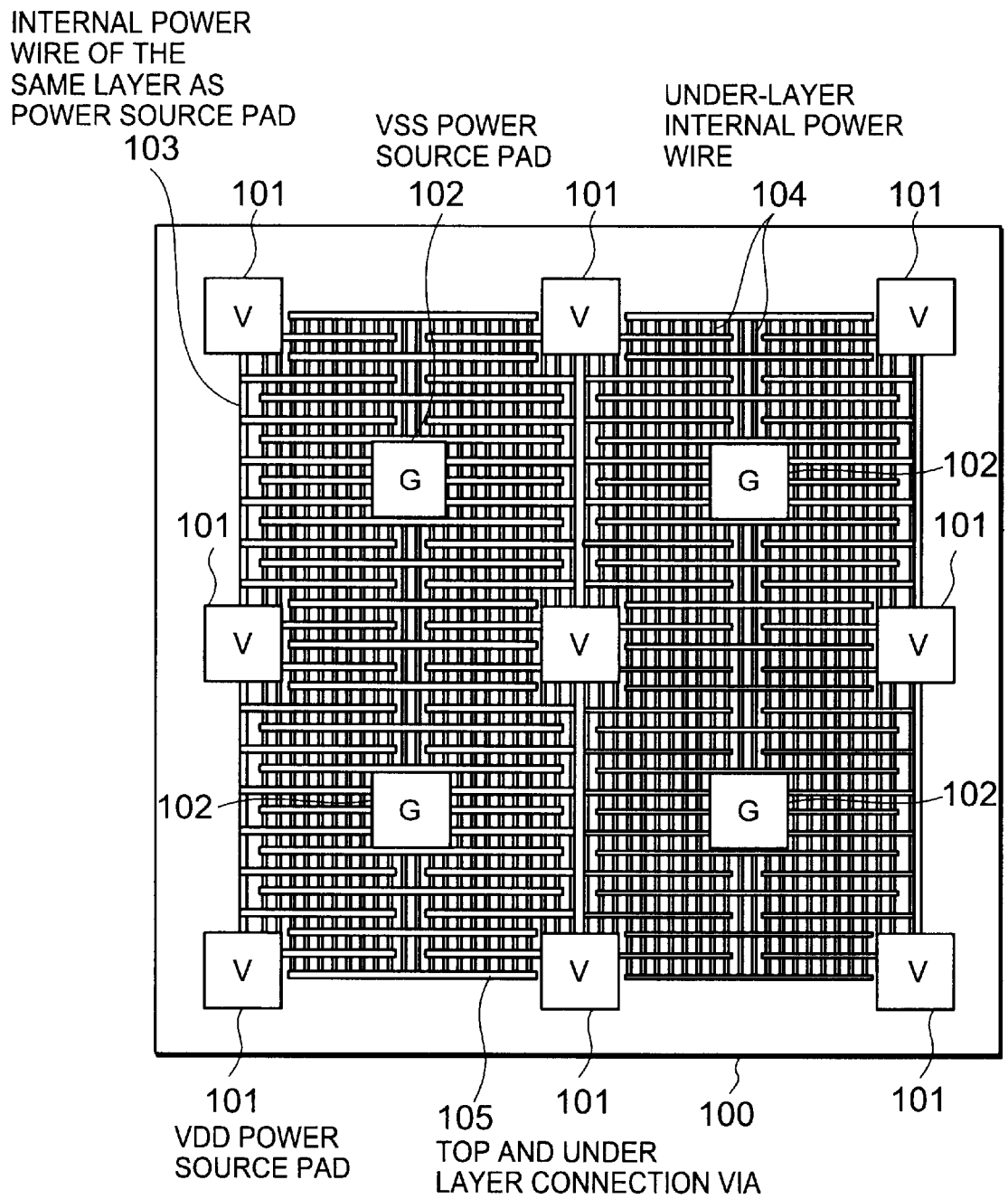
FIG. 1 is a schematic plan view of a semiconductor device of a first embodiment of the present invention.

Embodiments of the present invention will be described below in detail with reference to the drawings. Referring to FIG. 1, the feature of the present invention will be described.

The present invention includes a semiconductor device of a semiconductor chip in which a positive power source (hereinafter referred to as VDD) and a negative power source (hereinafter referred to as VSS) of a power terminal (internal power terminal) are arranged uniformly in the internal device region of the semiconductor chip and power is supplied from the outside of the semiconductor chip to the internal power terminal, wherein a metal of the same layer as the internal power terminal is wired between the internal power terminals in a tandem shape so as to be connected to the internal power terminal of the same potential, a top and under layer connection VIA is provided in the position where the tandem metalizing metal wire and an under layer metalizing metal cross so as to supply power to the power wire of the internal device region made of the under layer metal, and the internal region device can reduce a source voltage drop (IR-Drop) due to power consumption; and a power wiring method between the internal power terminals.

A first embodiment of the present invention will be described with reference to FIG. 1.

Figure 2:
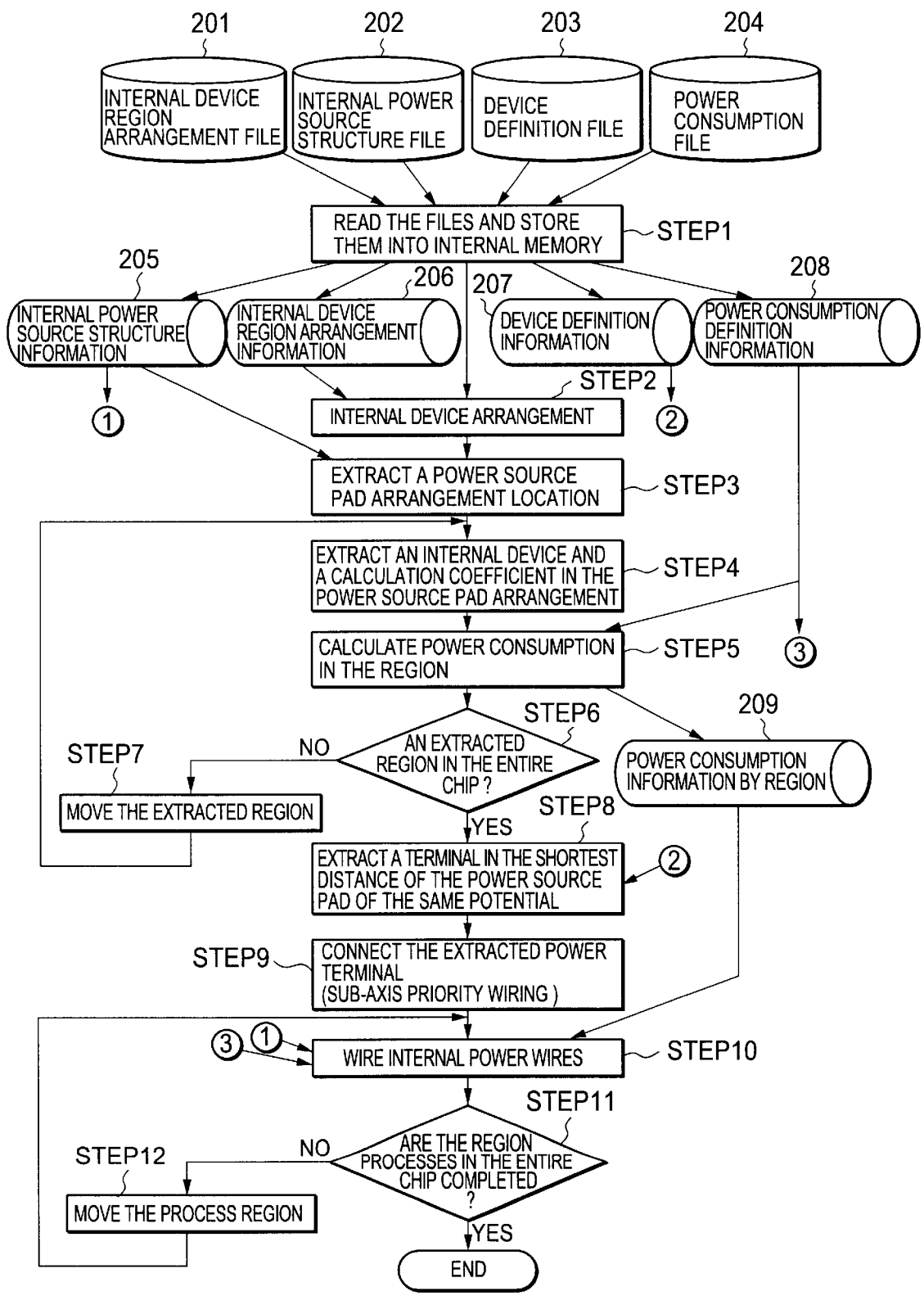
FIG. 2 is a chart showing a process flow of the present invention.

FIG. 1 shows a schematic plan view of a layout structure of a semiconductor device of the first embodiment of the present invention. FIG. 2 is a process flowchart for realizing the present invention.

Referring to FIG. 1, a semiconductor device 100 of the first embodiment of the present invention has a high potential power source (hereinafter referred to as a VDD power source) PAD 101; a low potential power source (hereinafter referred to as a VSS power source) PAD 102; an internal power wire 103 of the same layer as the power source PAD connecting the VDD power sources PAD 101 or the VSS power sources PAD 102, respectively; an under layer power wire 104 corresponding to each of the power source layers; and a top and under layer connection VIA 105 connecting the internal power wire 103 of the same layer as the power source PAD and the under layer power wire 104 corresponding to each of the power source layers.

When the power sources PAD (101, 102) are arranged in the internal device region of the semiconductor device 100 of the first embodiment of the present invention, the power sources PAD of the VDD power source PAD 101 and the VDD power source PAD 101, or the VSS power source PAD 102 and the VSS power source PAD 102 of the same potential aligned up and down are wired vertically from the center part of the top and bottom sides of the power source PAD using the metal wire 103 of the same layer as the power source PAD to connect the power sources PAD of the same potential aligned vertically.

A metal of the same layer as the wire connected vertically is used to be wired alternately in the horizontal direction straightening with the wire connected vertically so as not to overlap the wires of the VDD power source and the VSS power source each other. The power sources PAD are connected in a tandem shape.

The top and under layer connection VIA 105 is arranged at the cross point of the power wire of the same layer as the tandem power sources PAD and the under layer wire 104 straightening therewith so as to supply power to the internal region device.

Referring to FIG. 2, the step process contents of the process flow of this embodiment will be described.

A first step will be described.

In this step, the following files are stored temporarily into a read internal memory.

Figure 3:
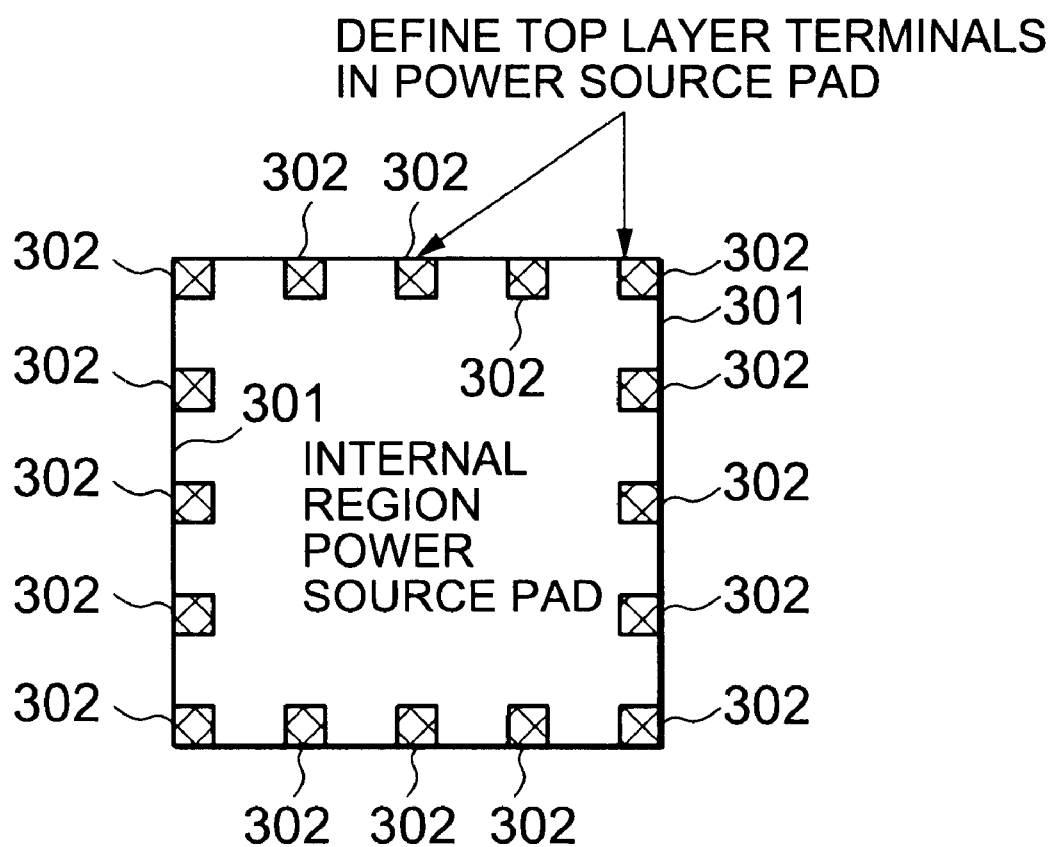
FIG. 3 is a setting diagram of an internal power source PAD and power terminals of the semiconductor device of the first embodiment of the present invention.

A device definition file in which the power terminals are provided in the power source PAD is stored as device definition information. FIG. 3 shows an image in which the power terminals are provided in the power source PAD.

Using a prior art automatic arrangement tool, an internal device arrangement file in which the power sources PAD and the internal devices are arranged in the internal device region of the semiconductor chip is stored as internal device region arrangement information. FIG. 4 shows images of the internal power source structures by power consumption.

Figure 4A:
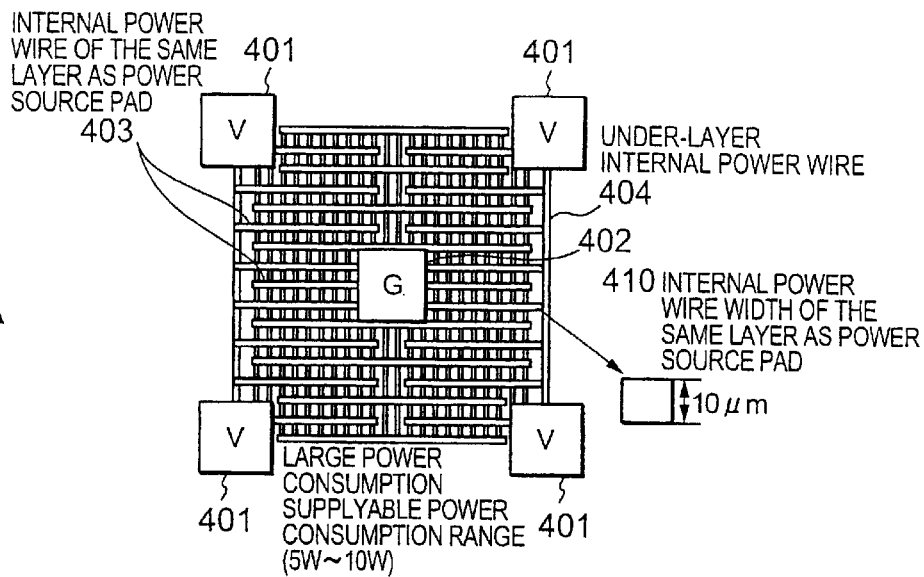
FIGS. 4A–4C are internal power source structure diagrams by power consumption of the semiconductor device of the first embodiment of the present invention.
Figure 4B:
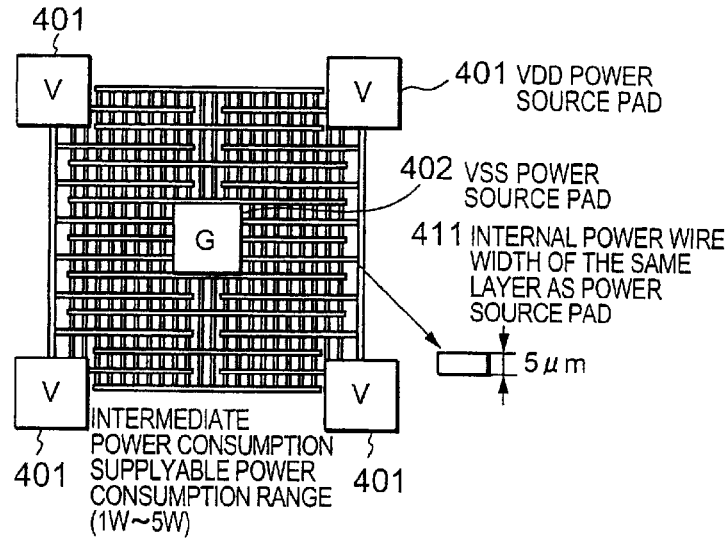
Figure 4C:
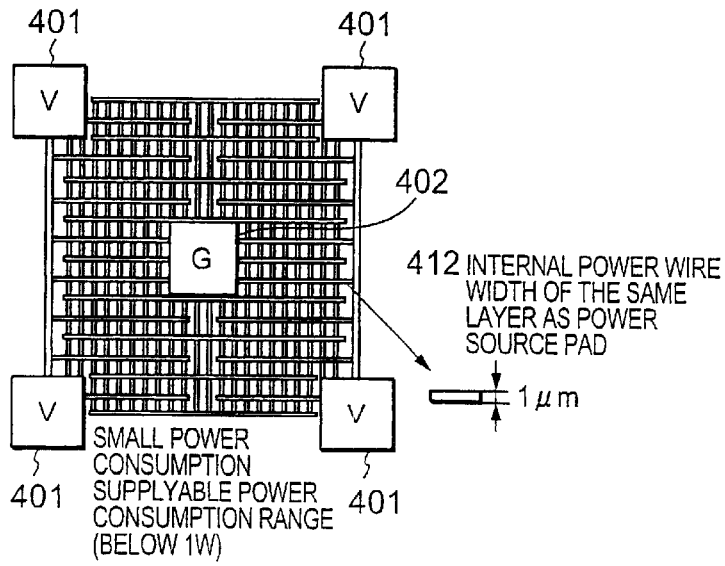

In the internal power source structures shown in FIG. 4A, FIG. 4A corresponds to the internal power source structure (the internal power wire width of 10 μm of the same layer as the power source PAD) in the case of large power consumption (5 W to 10 W); FIG. 4B corresponds to the internal power source structure (the internal power wire width of 5 μm of the same layer as the power source PAD) in the case of intermediate power consumption (1 W to 5 W); and FIG. 4C corresponds to the internal power source structure (the internal power wire width of 1 μm of the same layer as the power source PAD) in the case of small power consumption (below 1 W). That is, there are three types of the internal power source structure.

In this embodiment, there are three types of the internal power source structure. Two types or more may be used.

A power consumption file defining power consumption of the internal devices arranged in the internal device region of the semiconductor chip using the prior art automatic arrangement tool is stored as power consumption definition information. FIG. 5 shows an image of the power consumption file. For example, when an internal device function name is "INVERTER", the power consumption is 10 μW.

A second step will be described.

In this step, the arrangement information of the internal device and the power source PAD is extracted from the internal device region arrangement information to be stored temporarily into the internal memory as internal device arrangement information and power source PAD arrangement information.

In a third step, an internal device arrangement search region is set from the power source PAD arrangement information extracted in the second step to be stored temporarily into the internal memory as internal device arrangement search region information.

In the setting of the internal device arrangement search region, with the top as a square enclosed by the power source PAD (the VDD or VSS) of the same potential, the top power source PAD is based on the VDD or VSS.

In a fourth step, the internal device arranged in the region of the internal device arrangement search region information set in the third step is extracted from the internal device arrangement information.

When the internal device is across the internal device arrangement search regions, a coefficient calculating power consumption from the area ratio of the internal device thereacross is determined.

For example, when the area ratio across the internal device arrangement search regions is 3:7, the calculation coefficient in the internal device arrangement search region having the area ratio of 3 is 0.3, and the calculation coefficient in the internal device arrangement search region having the area ratio of 7 is 0.7.

The internal device arranged in the internal device arrangement search region not being across the adjacent internal device arrangement search region is extracted to have the calculation coefficient of 1.

In a fifth step, the result calculated as the total power consumption in the region from the internal device and the calculation coefficient extracted in the fourth step based on the power consumption definition information, is stored temporarily into the internal memory as power consumption information by region.

The power consumption of each of the internal devices arranged in the region is determined using the following equation:

the power consumption of each of the internal devices arranged in the region=(power consumption of the device)×(calculation coefficient)

The total power consumption in the region is determined using the following equation:

the total power consumption in the region=Σ (the power consumption of the internal devices arranged in the region)

In a sixth step, whether the region searches of the internal device arrangement search region information determined in the third step are all completed is checked. In the case that they are not completed, an internal device arrangement search region movement process of a seventh step is performed. When they are completed, decision to perform of the process of the next eighth step is made.

In the seventh step, region movement to the region in which the region search of the internal device arrangement search region information is not completed is performed to conduct the internal device extraction process in the region of the fourth step.

In an eighth step, the power terminal location of each of the power sources PAD is extracted from the power source PAD arrangement information and the device definition information. Then, a process for selecting the power terminal in which the power terminals of the same potential are in the shortest distance is performed to the entire semiconductor chip.

When there are a plurality of power terminals in the shortest distance, the power terminal in the center of each of the sides of the power source PAD is selected.

In a ninth step, the power terminals of the power source PAD of the same potential extracted in the eighth step are connected. A metal of the same layer as the power source PAD is used to connect the power terminals.

Wiring is performed first in the direction (sub-axis) straightening with the priority wiring direction (main axis) of the metal of the same layer as the power source PAD defined by the prior art automatic wiring tool, and is then performed in the wiring priority direction (main axis).

The wiring direction is set in any one of the right and up direction and the left and down direction from the power terminal.

When the power terminals of the power source PAD are connected first only in the direction (sub-axis) straightening with the wiring priority direction of the metal of the same layer as the power source PAD, the wiring process in the wiring priority direction (main axis) is not performed.

Figure 20:
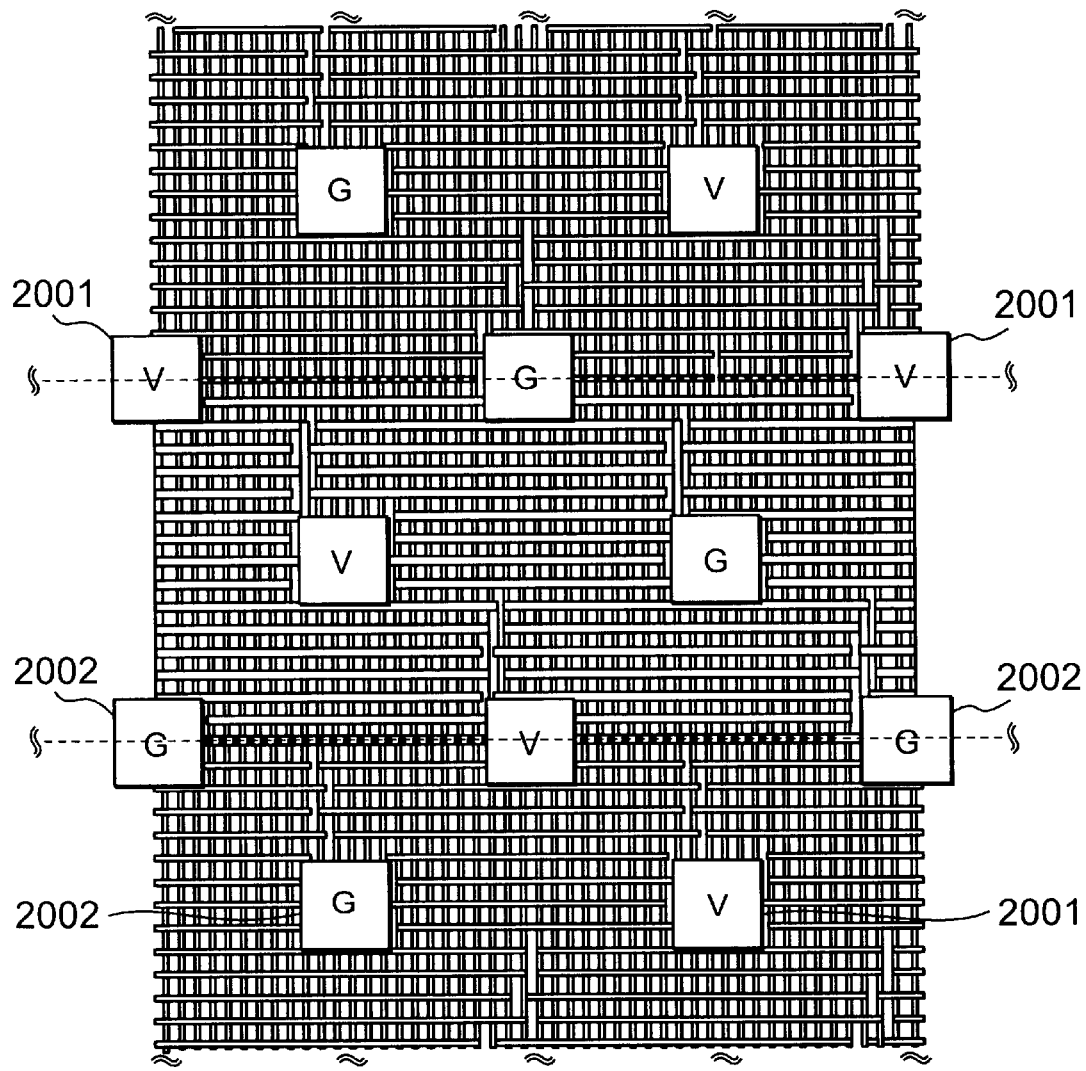
FIG. 20 is a schematic plan view of a semiconductor device of a third embodiment of the present invention.

As in Embodiment 3 shown in FIG. 20, when the power terminals of the power source PAD of the same potential are diagonal, they are wired first in the direction (sub-axis) straightening with the wiring priority direction of the metal of the same layer as the power source PAD, and are then wired in the wiring priority direction (main axis) for connection in an L-shape. For the wiring method, the prior art automatic wiring tool is used.

In a tenth step, the internal power source structure which can supply the power consumption of the power consumption information by region calculated in the fifth step for each of the internal device arrangement search region information determined in the third step is selected from the internal power source structure information to perform the internal power source wiring process.

The prior art automatic wiring tool is used in the internal power source wiring process.

In an eleventh step, whether the processes of the tenth step are all completed in the region of the internal device arrangement search region information determined in the third step is checked. When they are not completed, an internal device arrangement search region movement process of a twelfth step is performed. When they are completed, decision to terminate the process of the present information is made.

In the twelfth step, region movement to the region in which the tenth step process in the region of the internal device arrangement search region information is not completed is performed to conduct the internal power source wiring process of the tenth step.

As described above, the processes of the first to the twelfth steps are performed to realize the power wiring between the internal power terminals of the present invention.

The first embodiment of the present invention will be further described with reference to FIGS. 6 to 18.

FIG. 6 is an image of the internal device region arrangement information read in the first step. FIG. 6 shows a state that an internal device 610 is arranged between power sources PAD (601, 602).

Figure 7:
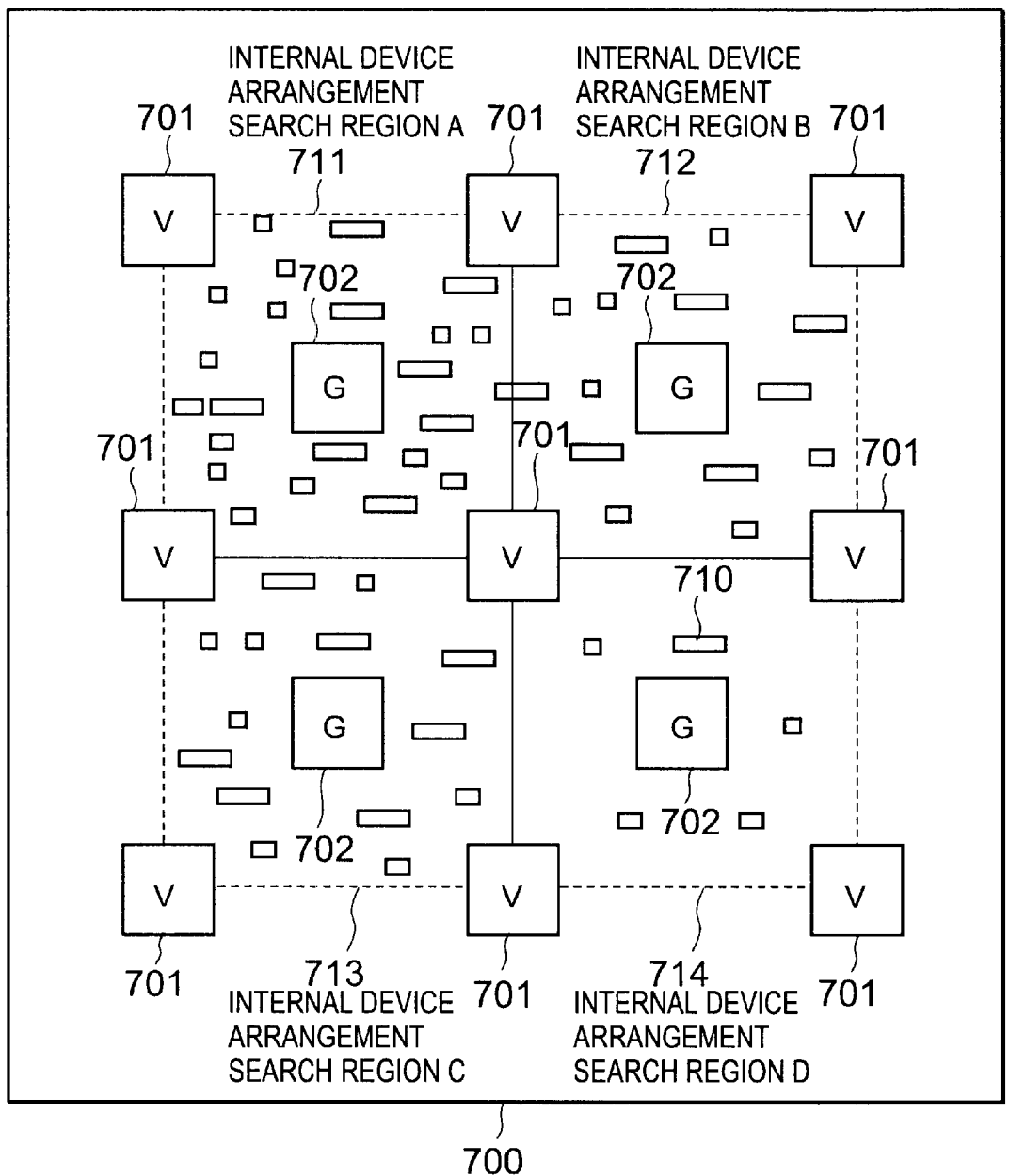
FIG. 7 is a diagram in the course of a second process of the semiconductor device of the first embodiment of the present invention.

After extracting the arrangement information of the internal device and the power source PAD in the second step, the internal device arrangement search region is set in the third step. In this embodiment, a power source PAD (VDD) 701 is set as the top of the internal device arrangement search region, as shown in FIG. 7. Four regions of an internal device arrangement search region A711 to an internal device arrangement search region D714 are set.

Figure 8:
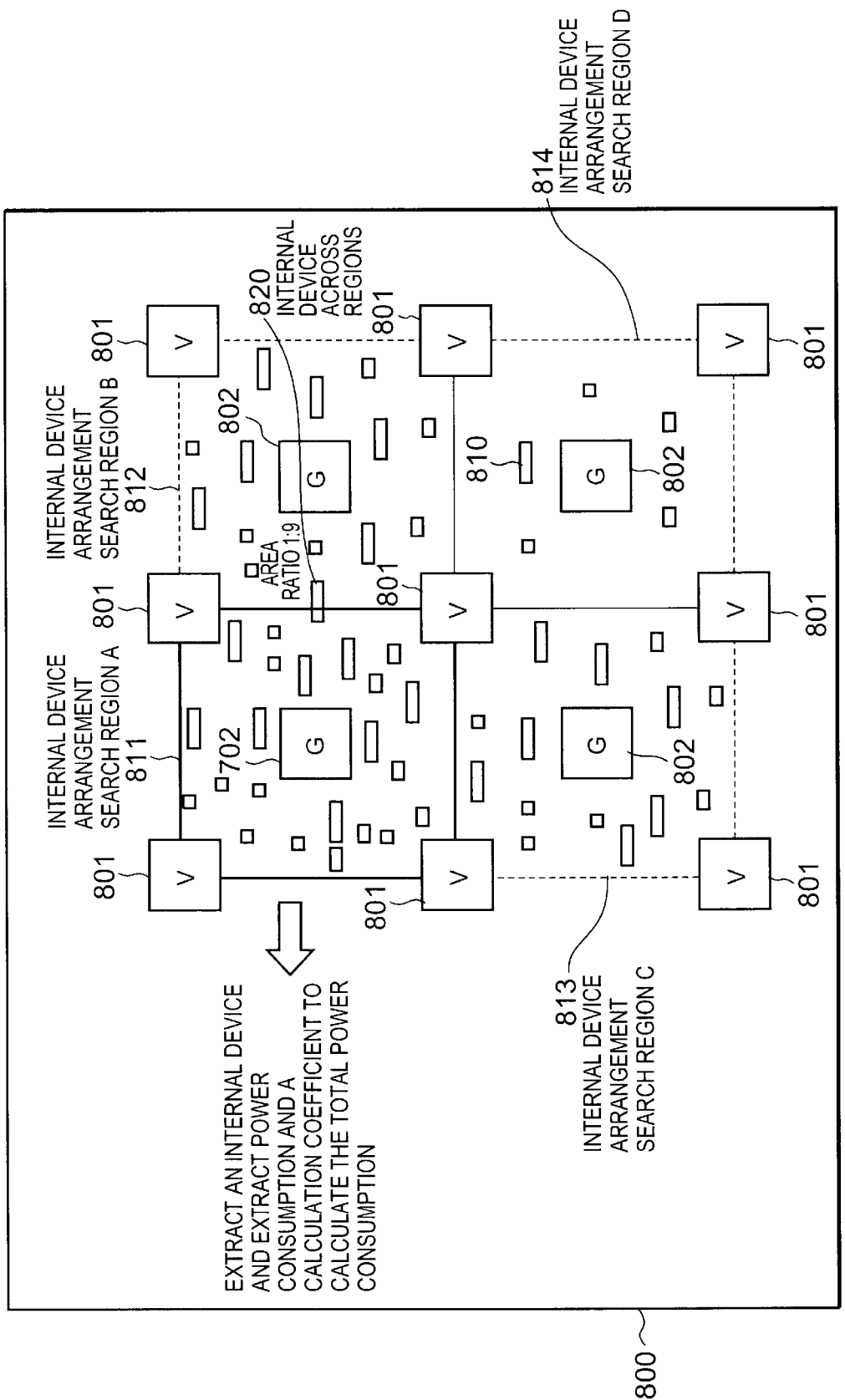
FIG. 8 is a diagram in the course of a third process of the semiconductor device of the first embodiment of the present invention.

In an internal device arrangement search region A811 shown in FIG. 8, the process of the fourth step is performed to extract an internal device 810 arranged in a region 800, determining the calculation coefficient.

An internal device 820 across the internal device arrangement search region A811 and an internal device arrangement search region B812 has its area ratio of 1:9. The calculation coefficient of the internal device is set to 0.1 in the internal device arrangement search region A811. Other internal devices are included in the internal device arrangement search region A811 to be set to the calculation coefficient of 1.

Based on the extracted internal device and calculation coefficient and the power consumption definition information of FIG. 5, in the process of the fifth step, the total power consumption in the internal device arrangement search region A811 is determined to be stored into the power consumption information by region.

In the sixth and seventh steps, the region movement of the internal device arrangement search region is performed to conduct the processes of the fourth and fifth steps, as described above, determining the power consumption information by region to the entire region.

Figure 9:
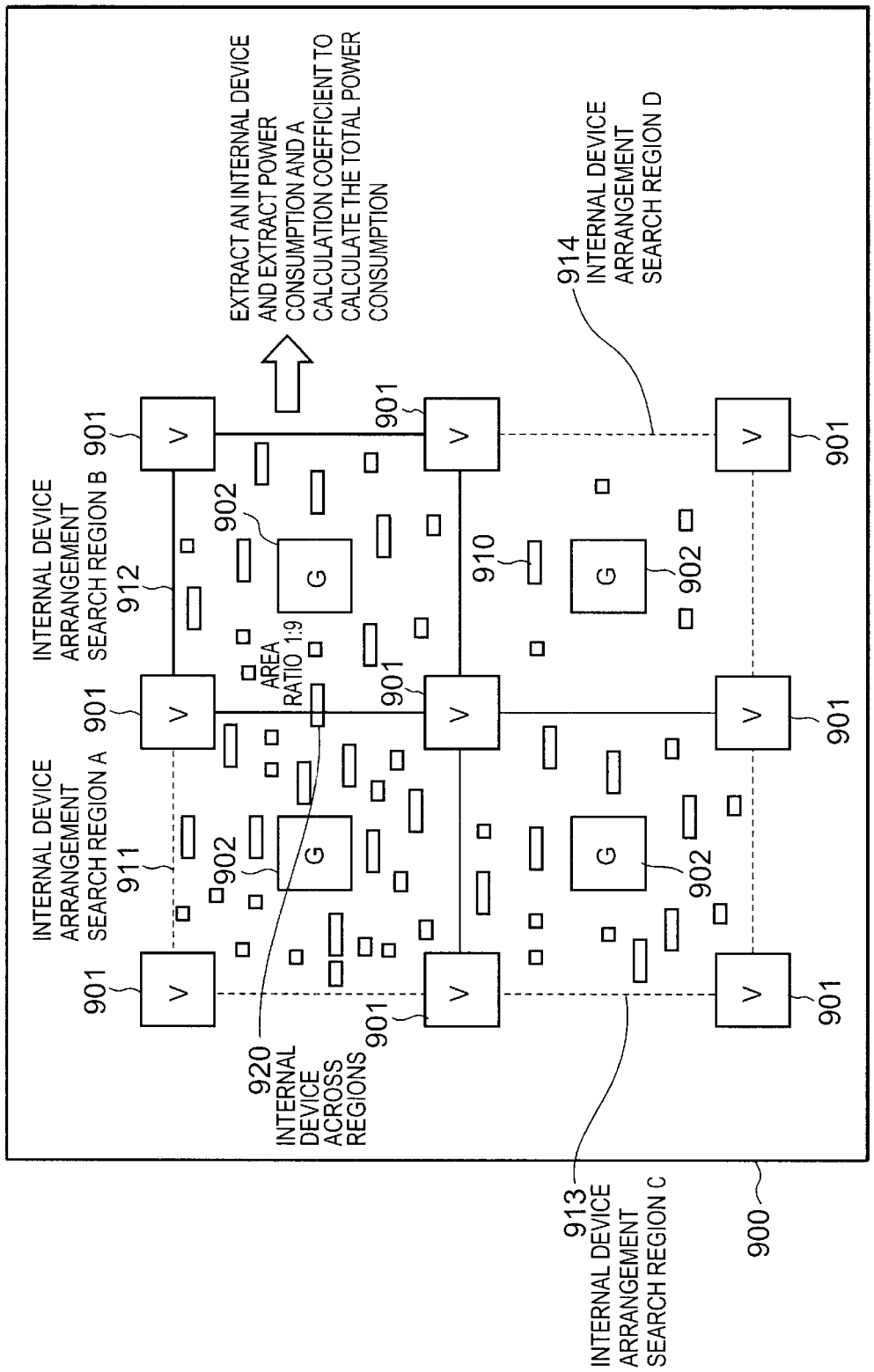
FIG. 9 is a diagram in the course of a fourth process of the semiconductor device of the first embodiment of the present invention.

FIG. 9 shows the case of performing the processes of the fourth and fifth steps by region movement to an internal device arrangement search region B912.

Figure 10:
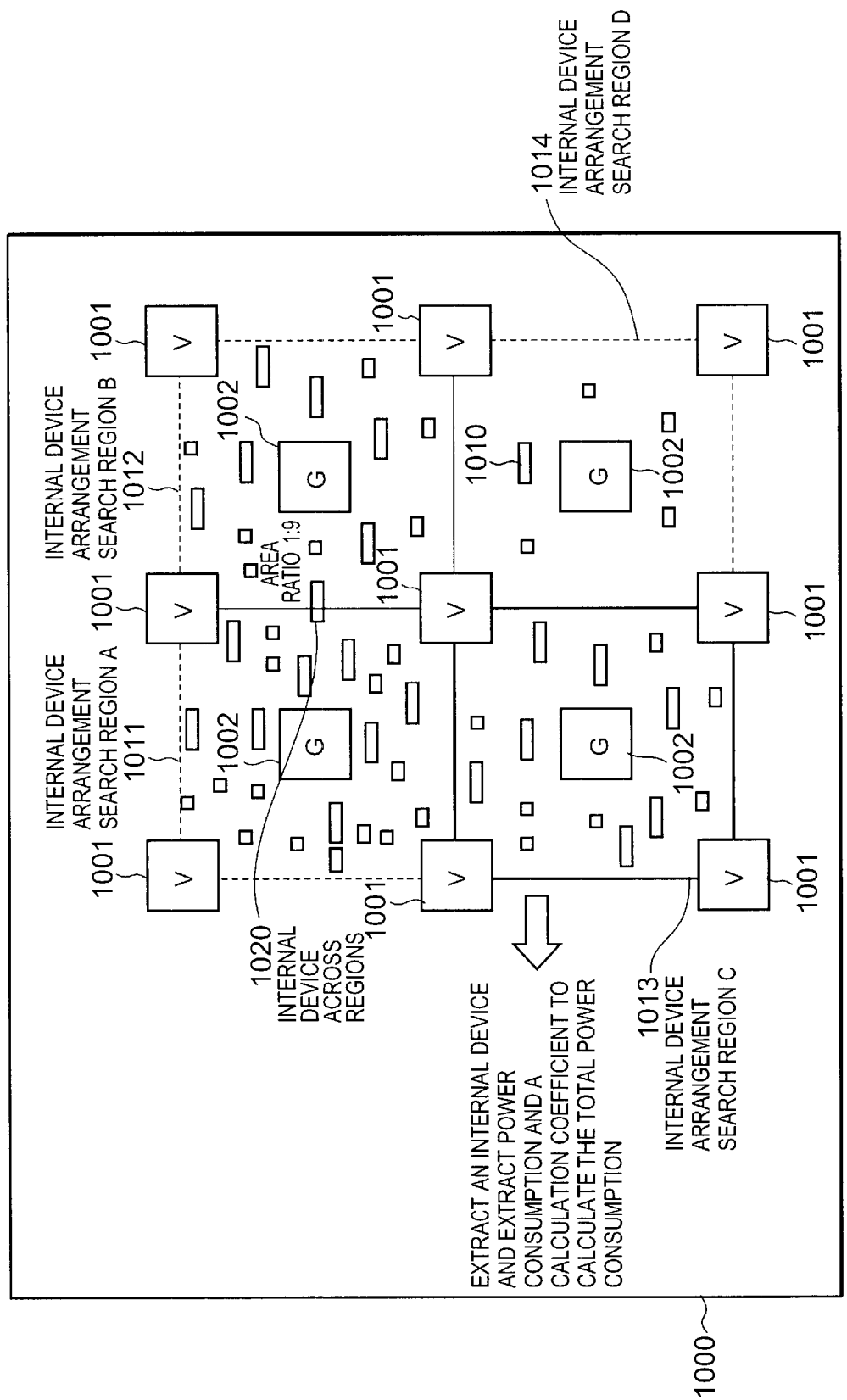
FIG. 10 is a diagram in the course of a fifth process of the semiconductor device of the first embodiment of the present invention.

FIG. 10 shows the case of performing the processes of the fourth and fifth steps by region movement to an internal device arrangement search region C1013.

Figure 11:
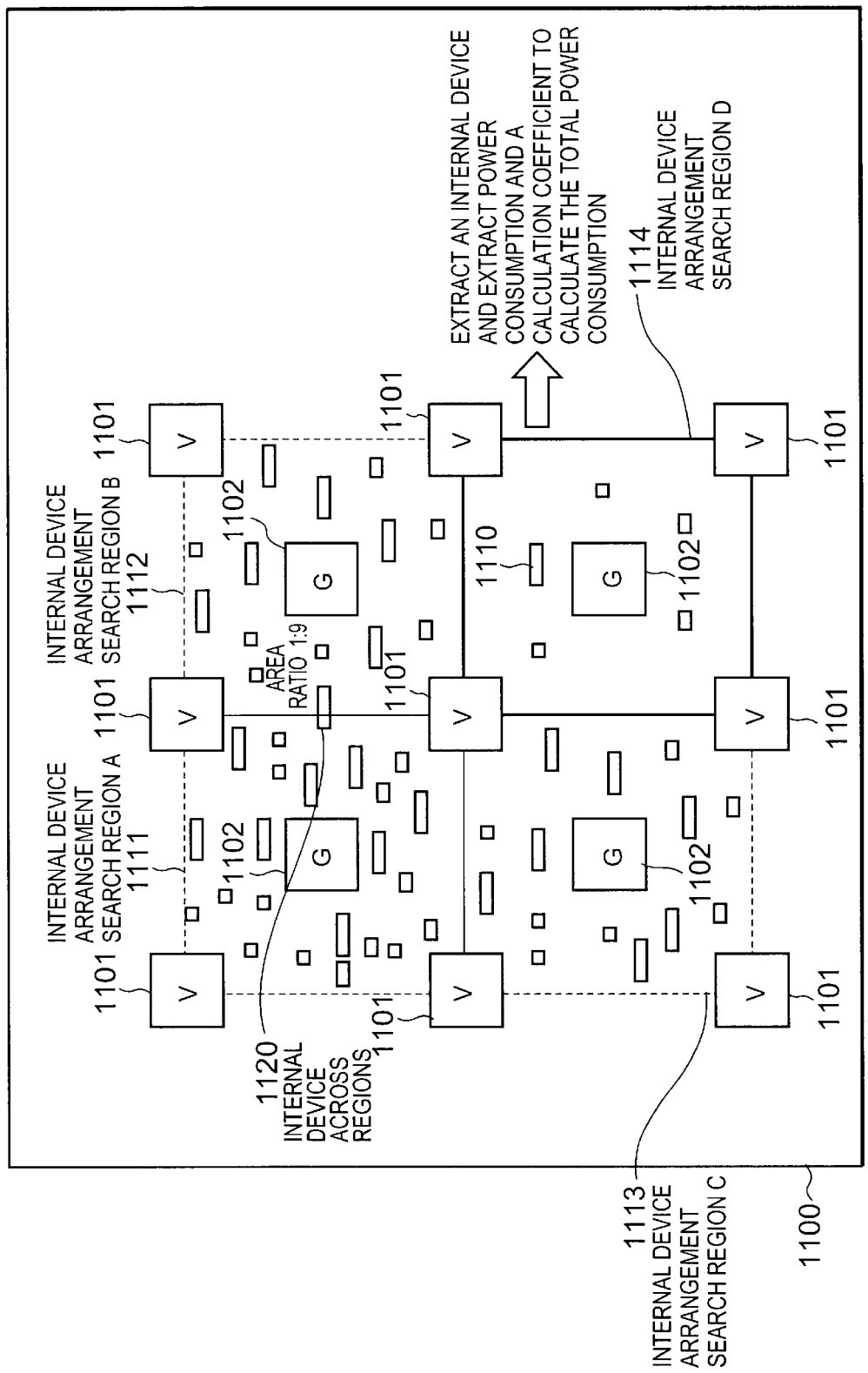
FIG. 11 is a diagram in the course of a sixth process of the semiconductor device of the first embodiment of the present invention.

FIG. 11 shows the case of performing the processes of the fourth and fifth steps by region movement to an internal device arrangement search region D1114.

In this embodiment, the total power consumption of each of the internal device arrangement search regions is determined as follows:

Internal device arrangement search region A: 6W
Internal device arrangement search region B: 4W
Internal device arrangement search region C: 3W
Internal device arrangement search region D: 0.9W When completing the fourth and fifth steps by region movement to the internal device arrangement search region D, completion of search of the internal device arrangement search region is decided in the sixth step to perform the power terminal extraction process of the power source PAD of the eighth step.

Figure 12:
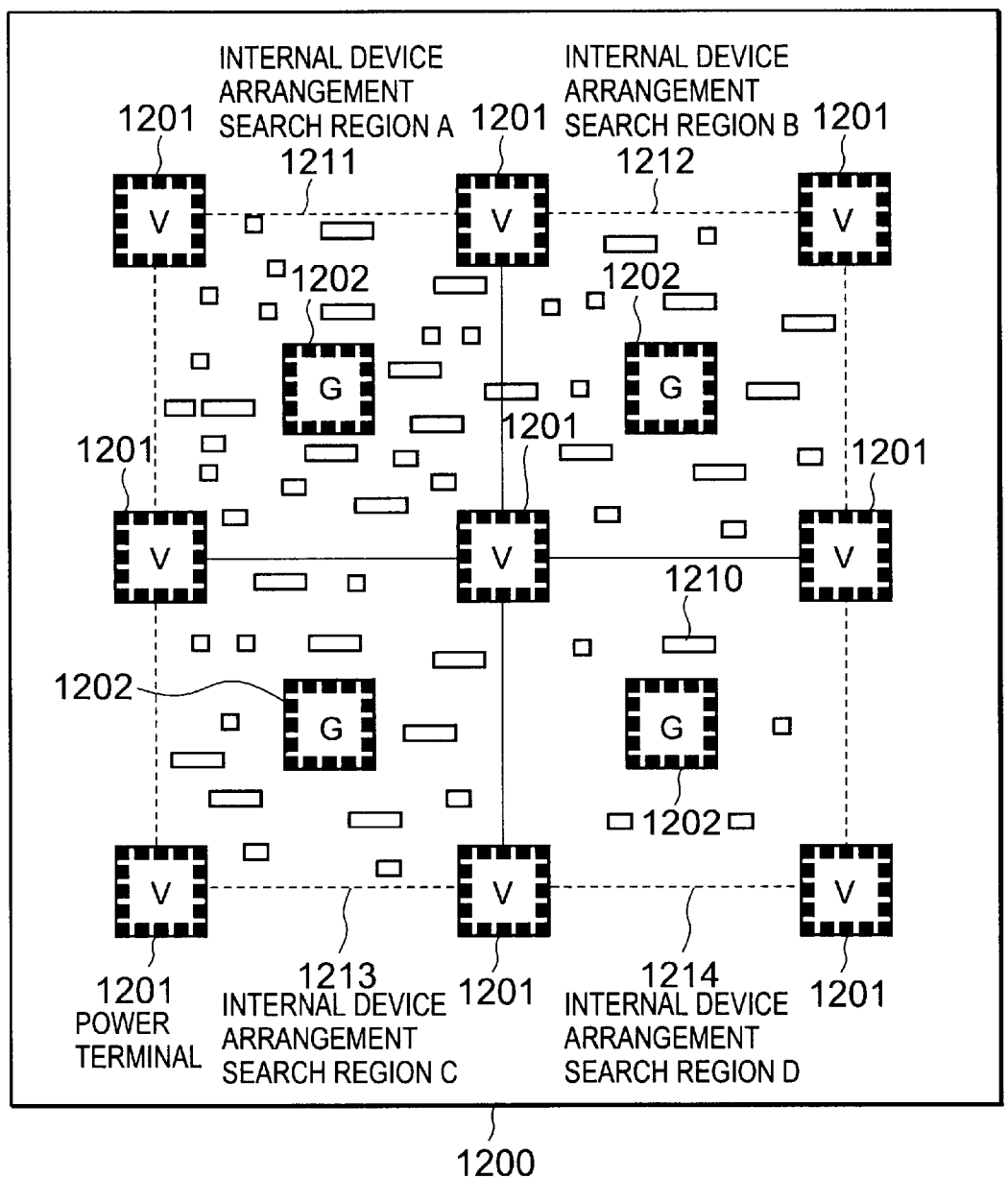
FIG. 12 is a diagram in the course of an eighth process of the semiconductor device of the first embodiment of the present invention.

The process of the eighth step is performed to conduct the power terminal extraction of the power source PAD. As shown in FIG. 12, the power terminal extraction process extracts the power terminal location of the power source PAD arranged in the internal region of the semiconductor chip based on the power source PAD arrangement information extracted in the second step and the device definition information of FIG. 3 read in the first step.

After extracting the power terminal location, the power terminal in which the power terminals of the same potential are in the shortest distance is extracted.

Figure 13:
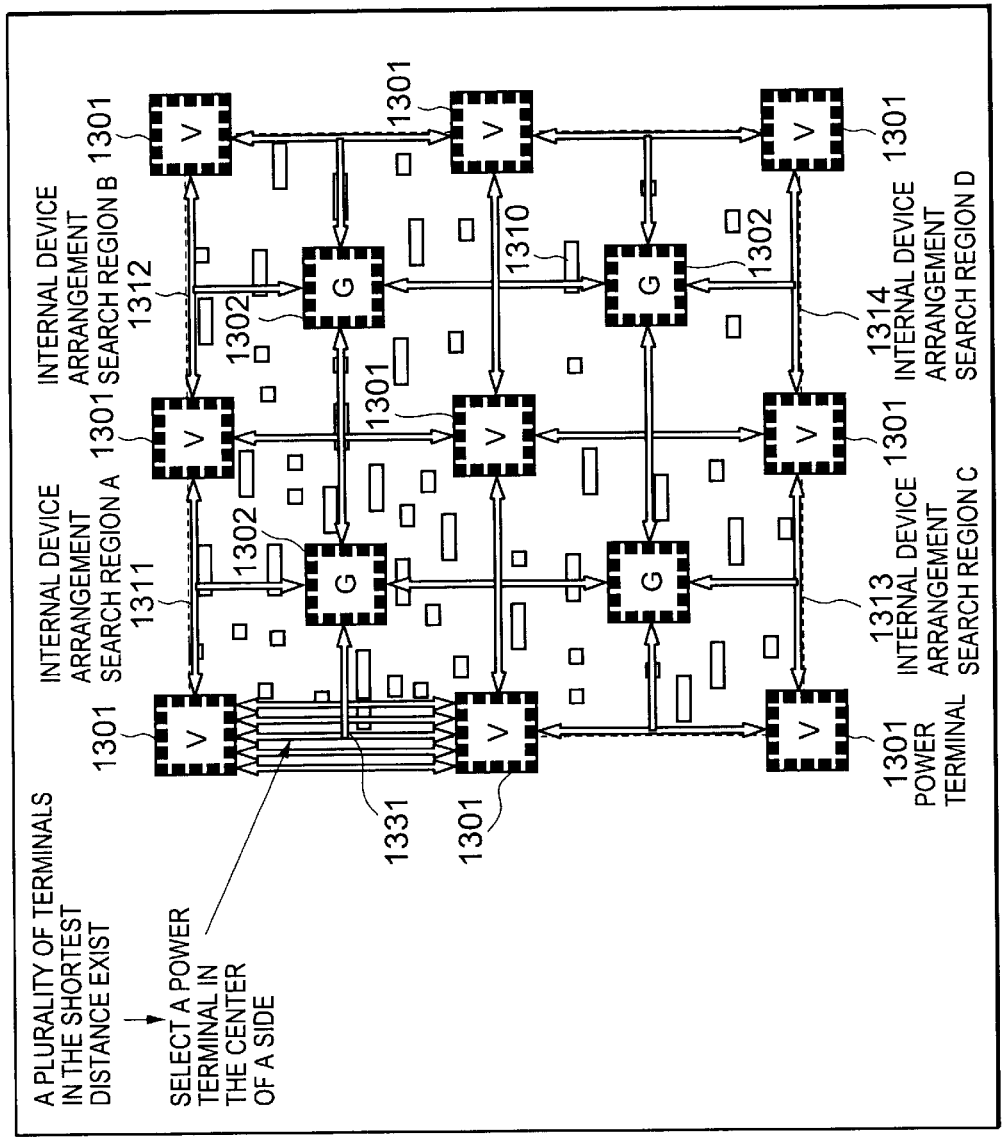
FIG. 13 is a diagram in the course of a ninth process of the semiconductor device of the first embodiment of the present invention.

In FIG. 13, there are the power sources PAD of the same potential in the upper, lower, right and left portions. The power terminal in the shortest distance exists on each of the sides of the power source PAD. The power terminal in the center of each of the sides of the power source PAD is selected.

Figure 14:
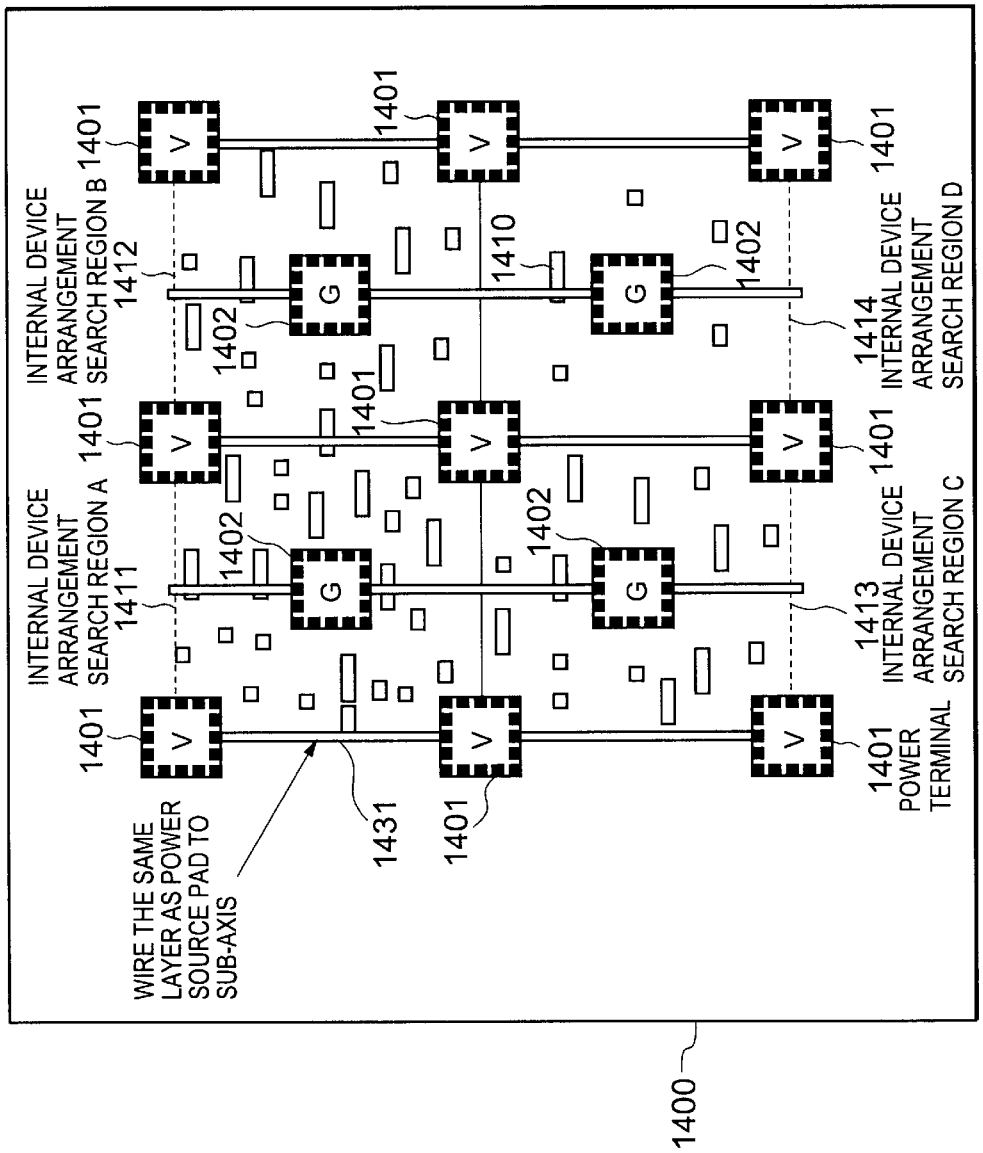
FIG. 14 is a diagram in the course of a tenth process of the semiconductor device of the first embodiment of the present invention.

In the process of the ninth step, the extracted power terminals of the power source PAD are connected in the sub-axis direction by the metal of the same layer as the power source PAD, as shown in FIG. 14.

In FIG. 14, since the power terminals are connected by the wiring in the sub-axis direction, the main axis direction wiring process is not performed. After completing connection of the power terminal connection of the power source PAD, the internal power source wiring process of the tenth step is performed.

Based on the power consumption information by region, the internal power source structure which can sufficiently supply the total power consumption of the internal device arrangement search region A is selected from the internal power source structure information read in the first step to be wired by the prior art automatic arrangement tool.

The processes of the tenth, eleventh and twelfth steps are performed to all the internal device arrangement search regions.

Figure 15:
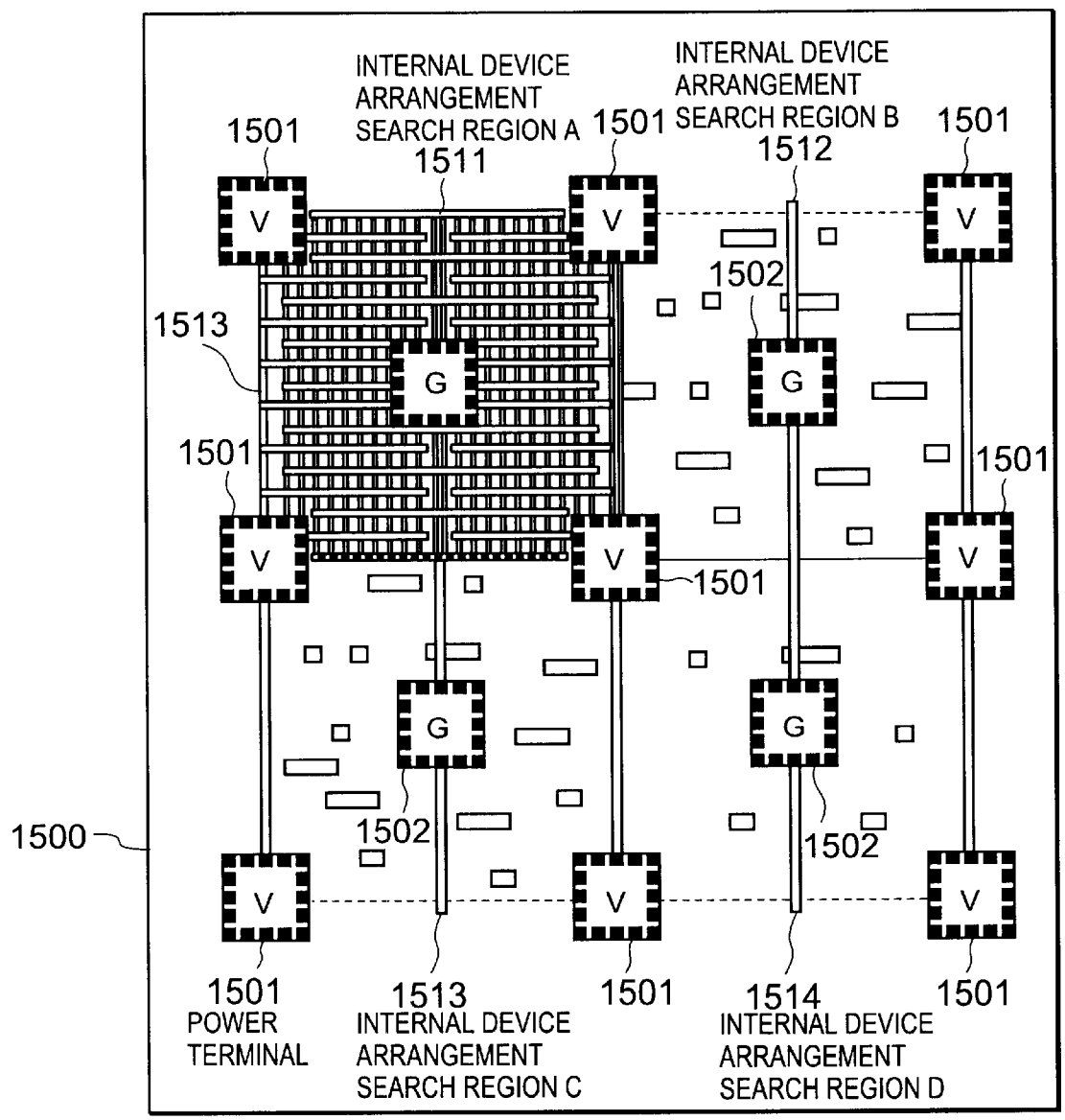
FIG. 15 is a diagram in the course of an eleventh process of the semiconductor device of the first embodiment of the present invention.

The total power consumption of the inner device arrangement search region A is determined to be 6W in the fifth step. As shown in FIG. 15, the power wire of the large power consumption type (FIG. 4A) of the internal power source structure information is selected. The same process is performed to the regions.

Figure 16:
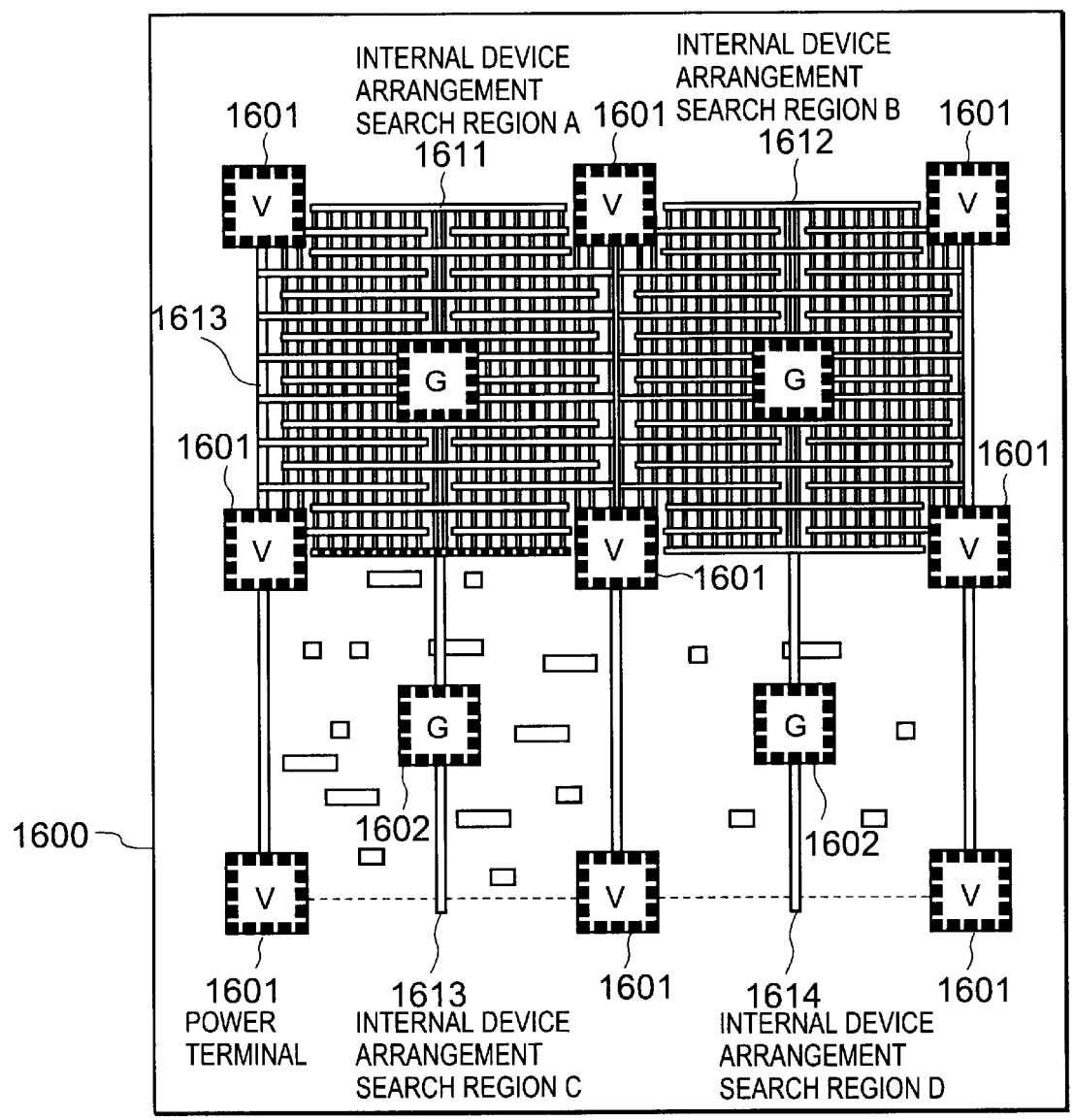
FIG. 16 is a diagram in the course of a twelfth process of the semiconductor device of the first embodiment of the present invention.

The total power consumption of the internal device arrangement search region B is determined to be 4W in the fifth step. As shown in FIG. 16, the power wire of the intermediate power consumption type (FIG. 4B) of the internal power source structure information is selected.

Figure 17:
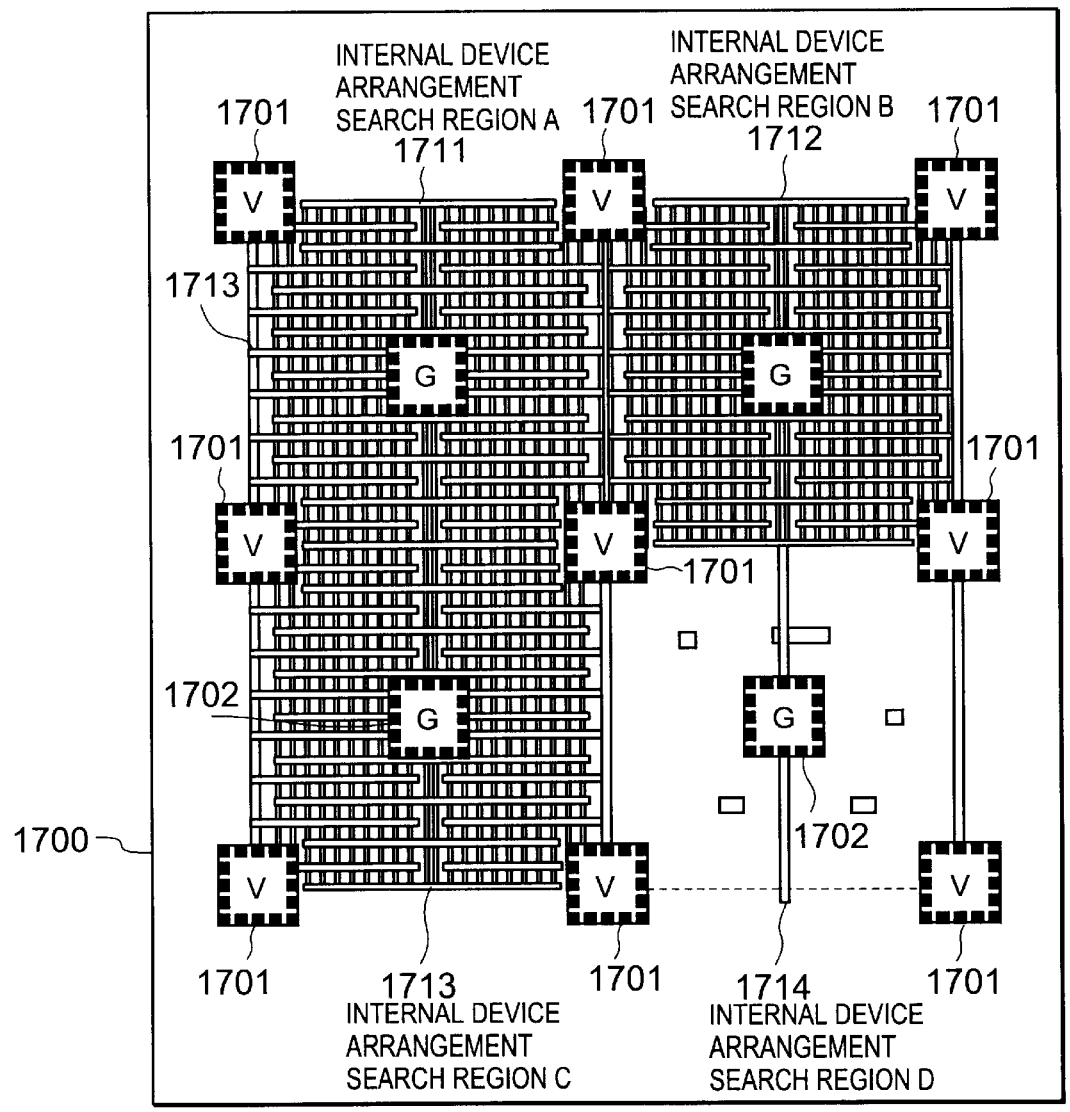
FIG. 17 is a diagram in the course of a thirteenth process of the semiconductor device of the first embodiment of the present invention.

The total power consumption of the internal device arrangement search region C is determined to be 3W in the fifth step. As shown in FIG. 17, the power wire of the intermediate power consumption type (FIG. 4B) of the internal power source structure information is selected.

Figure 18:
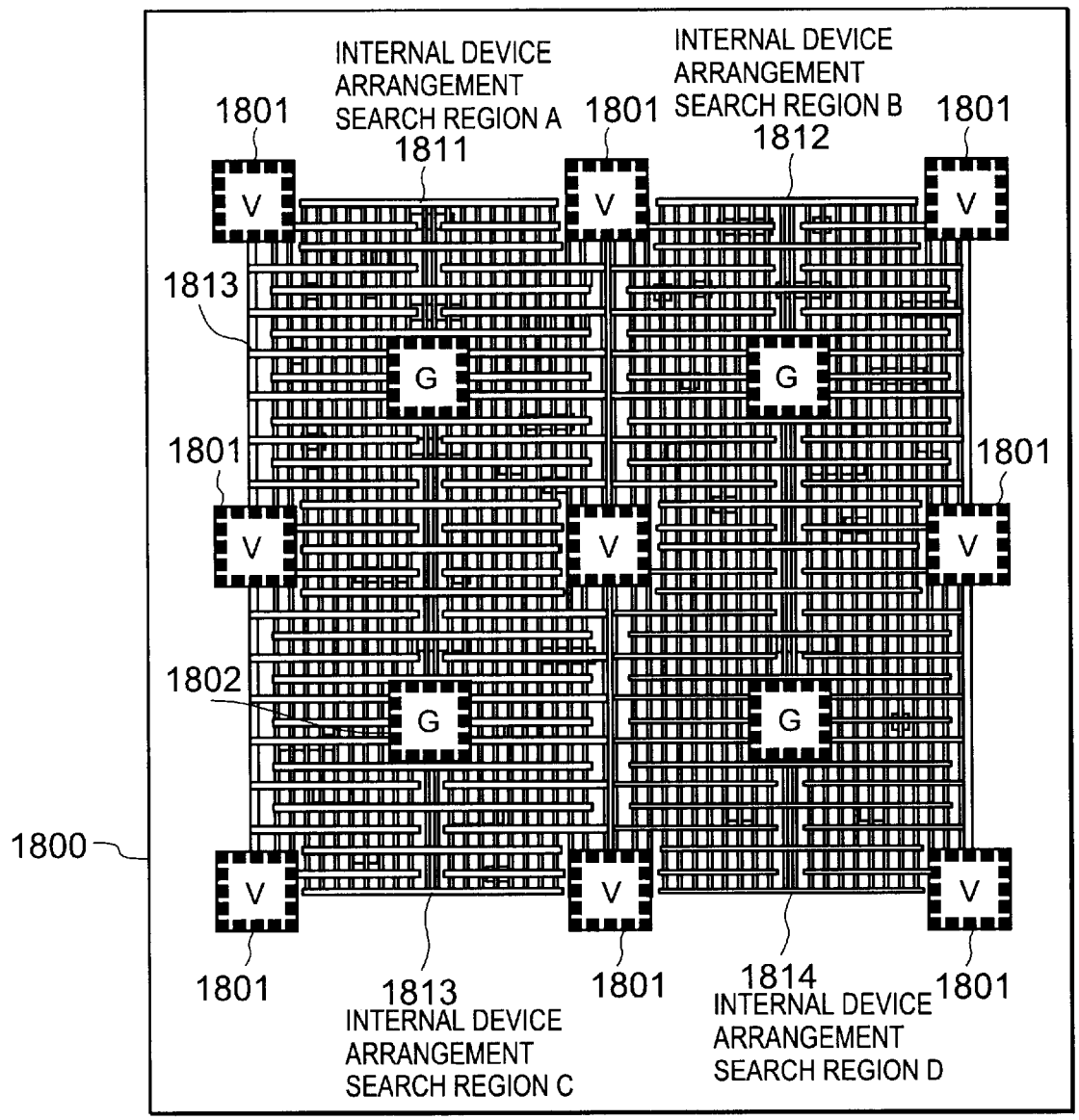
FIG. 18 is a diagram in the course of a fourteenth process of the semiconductor device of the first embodiment of the present invention.

The total power consumption of the internal device arrangement search region D is determined to be 0.9W in the fifth step. As shown in FIG. 18, the power wire of the small power consumption type (FIG. 4C) of the internal power source structure information is selected.

As described above, the internal power source wiring is performed between the power sources PAD of the first embodiment of the present invention to complete the process.

A second embodiment of the present invention will be described with reference to FIG. 19.

Figure 19:
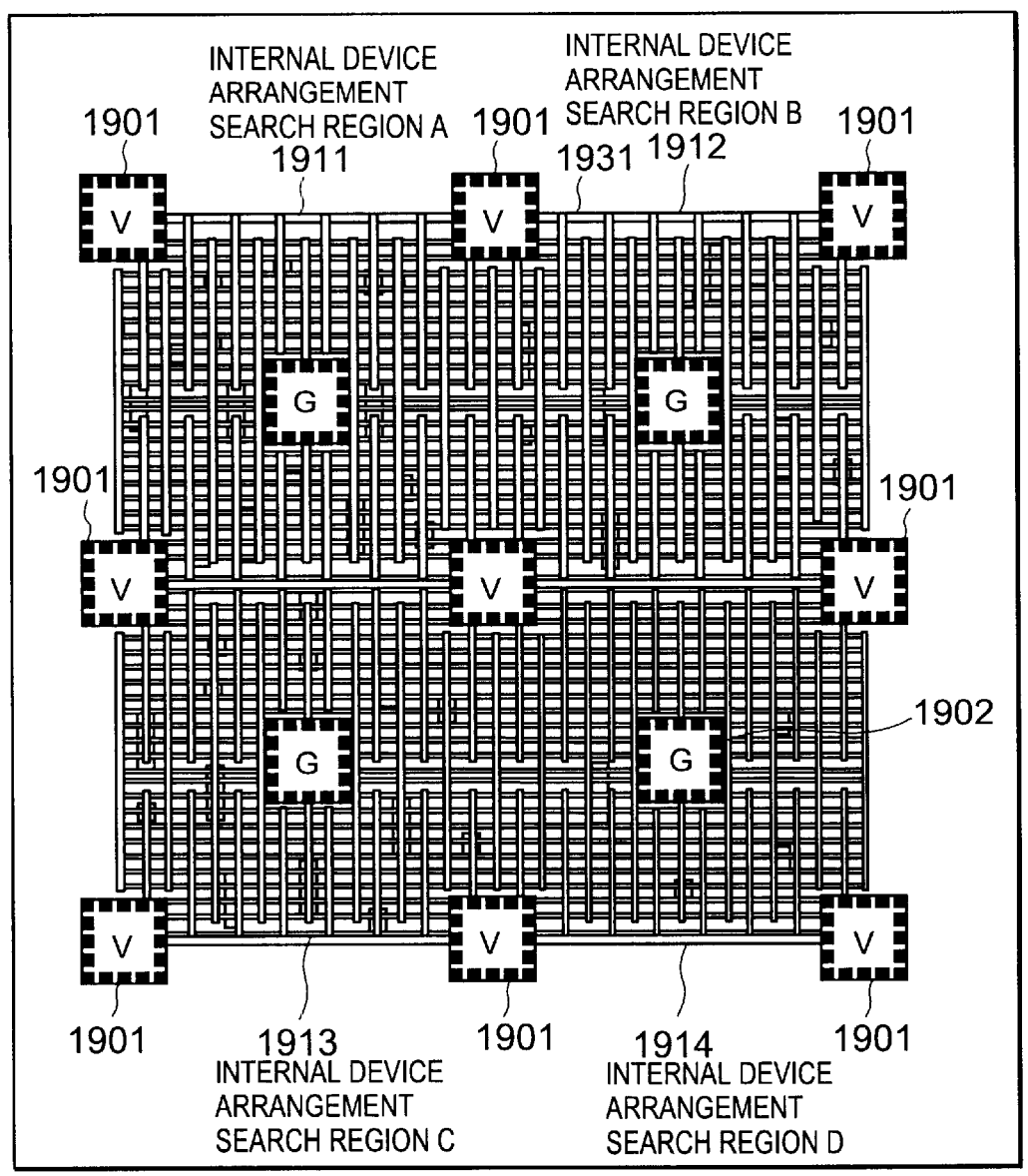
FIG. 19 is a schematic plan view of a semiconductor device of a second embodiment of the present invention.

Referring to FIG. 19, in the second embodiment of the present invention, the priority wiring direction of the metal of the same layer as the power source PAD is vertical. As in the first embodiment of the present invention, the power wiring can be done between the internal power sources PAD.

In the second embodiment of the present invention, the first embodiment of the present invention is rotated 90 degrees to the left for inversion on the X axis.

A VDD power source PAD 1901 corresponds to the VDD power source PAD 101 of FIG. 1. A VSS power source PAD 1902 corresponds to the VSS power source PAD 102 of FIG. 1. A wire 1931 corresponds to the wire 103 of the FIG. 1.

A third embodiment of the present invention will be described with reference to FIG. 20.

In the third embodiment of the present invention, the power sources PAD of the same potential are arranged diagonally. In other words, a VDD power source PAD 2001 is arranged from the reference PAD in the right and down direction and a VSS power source PAD 2002 is also arranged from the reference PAD in the right and down direction.

Figure 21A:
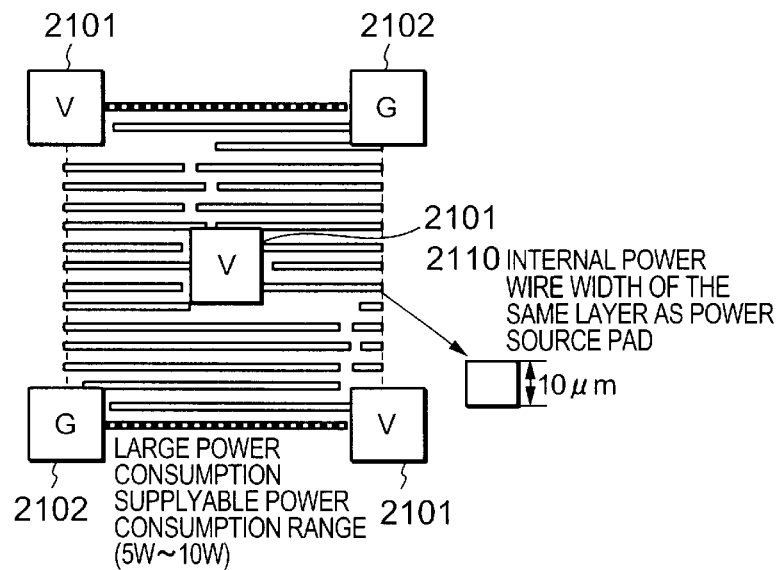
FIGS. 21A–21C are internal power source structure diagrams by power consumption of the semiconductor device of the third embodiment of the present invention.
Figure 21B:
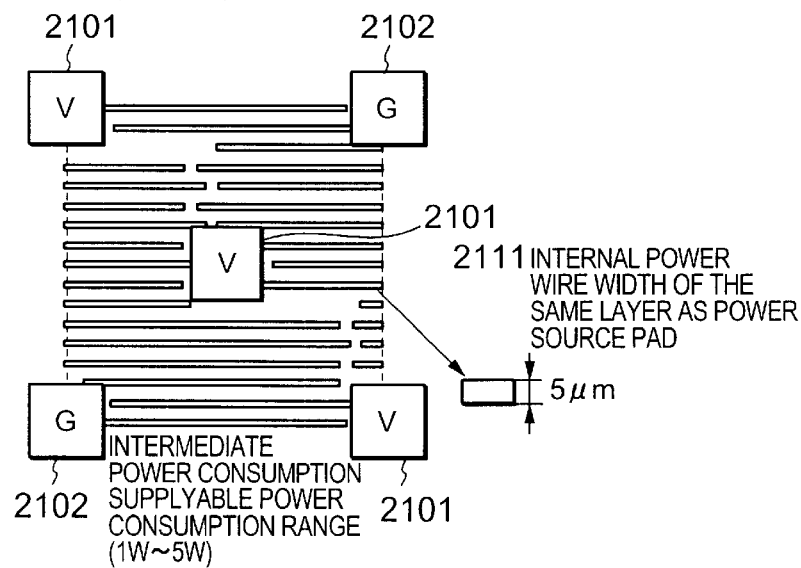
Figure 21C:
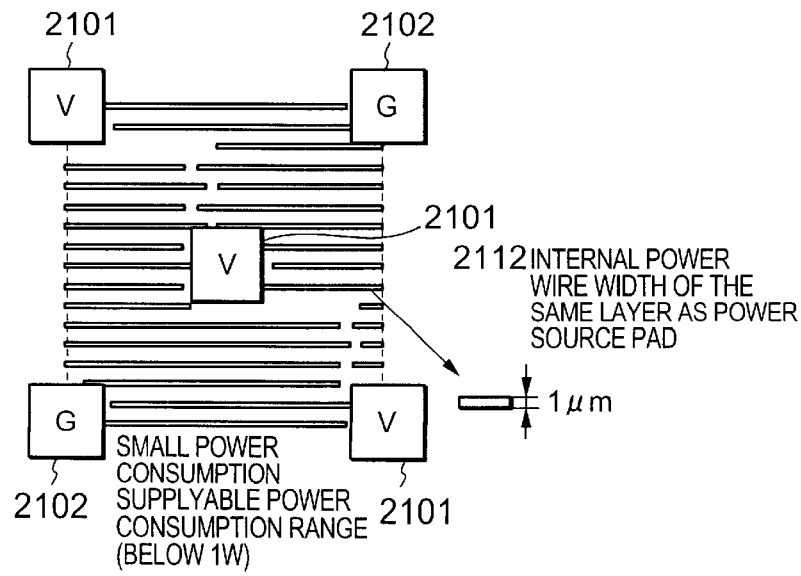

In the third embodiment of the present invention, as shown in FIGS. 21A to 21C, an internal power source structure file defining the internal structure which can sufficiently supply the power consumption of the semiconductor chip by power consumption range is set to be separated from the first and second embodiments of the present invention and is stored into the internal memory as the internal power source structure information.

In the method for connecting the power sources PAD of the same potential, the power terminal in which the power terminals provided in the power source PAD of the same potential are in the shortest distance is selected in the eighth step shown in the process flowchart of FIG. 2.

In the third embodiment of the present invention, the power sources PAD of the same potential are arranged diagonally. The location in which the power terminals are in the shortest distance is at the power terminal provided on the corner of the power source PAD.

The process of the ninth step is performed as follows. According to the limit of the wiring direction set in the eighth step, when connecting the power sources PAD of the same potential, wiring is performed first in the direction (sub-axis) straightening in the priority wiring direction of the metal of the same layer from the power source PAD at the wiring start point. The wiring direction is switched from the same coordinate as the power source PAD of the wiring endpoint (the Y coordinate for vertical wiring and the X coordinate for horizontal wiring) to the priority wiring direction (main axis) for connection to the power terminal at the wiring end point. The present invention is thus realized.

Figure 22:
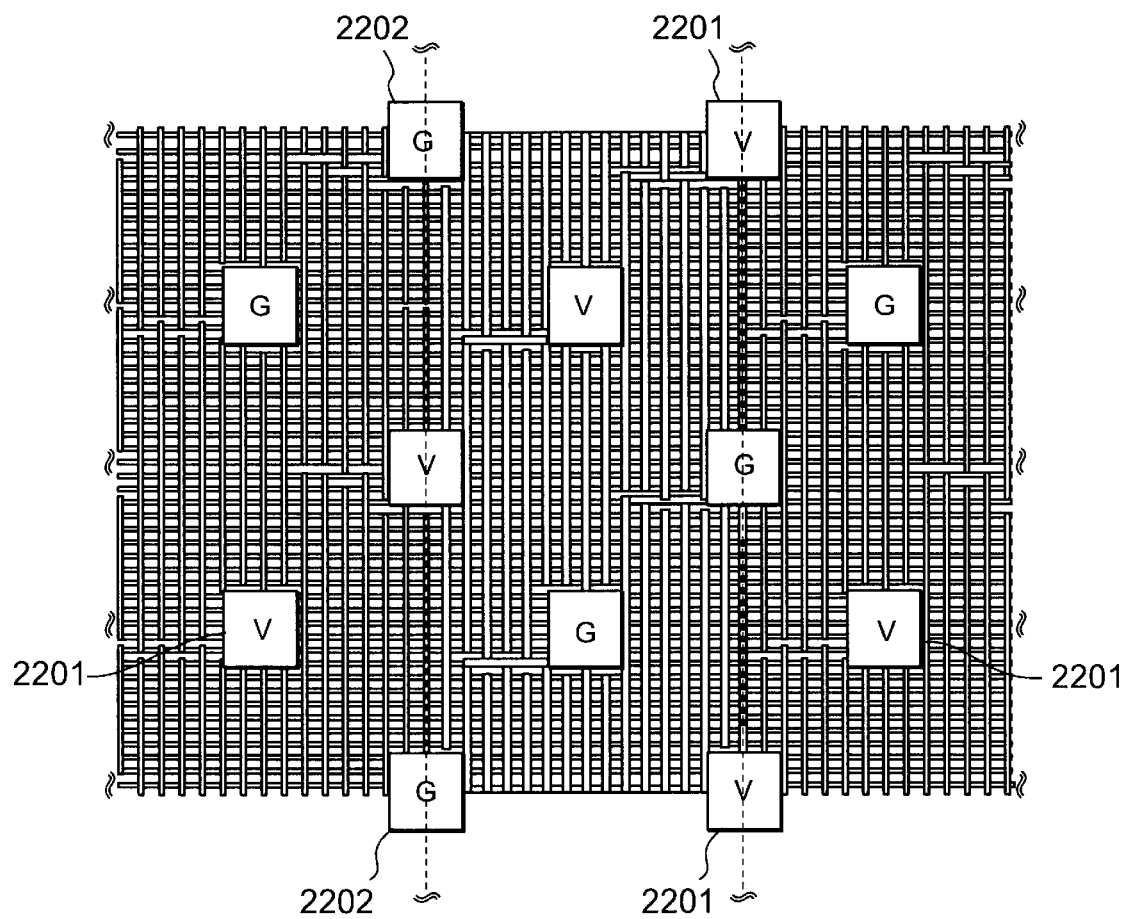
FIG. 22 is a schematic plan view of a semiconductor device of a fourth embodiment of the present invention.
Figure 23:
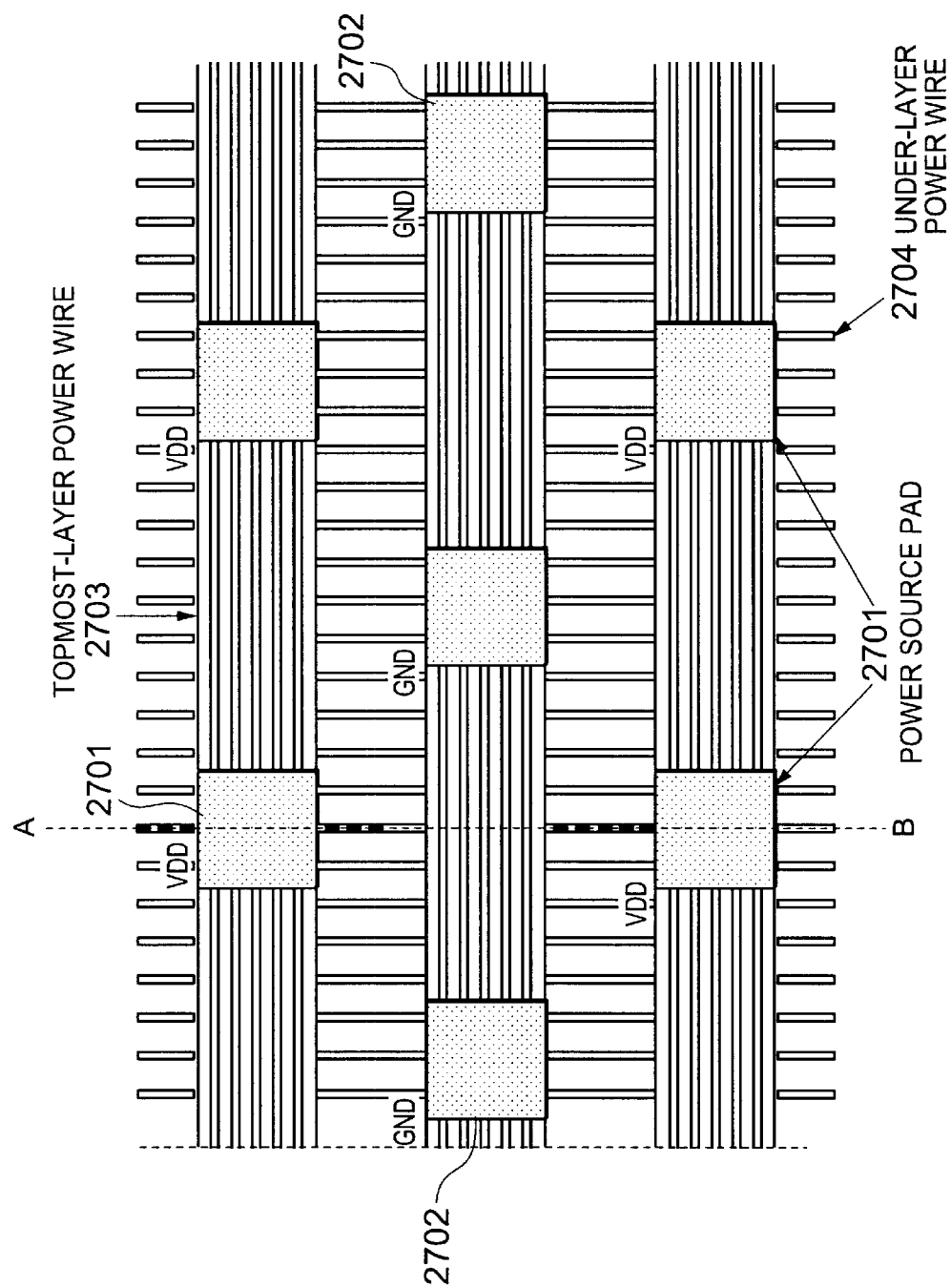
FIG. 23 is a schematic plan view of a power wire between power sources PAD of a prior art semiconductor device.

A fourth embodiment of the present invention will be described with reference to FIG. 22.

In the fourth embodiment of the present invention, the priority wiring direction of the metal of the same layer as the power source PAD is vertical. As in the third embodiment of the present invention, the power source wiring is performed between the internal power sources PAD.

In the fourth embodiment of the present invention, the third embodiment of the present invention is rotated 90 degrees to the left. A VDD power source PAD 2201 corresponds to the VDD power source PAD 2001 of FIG. 20. A VSS power source PAD 2202 corresponds to the VSS power source PAD 2002 of FIG. 20.

Figures 24, 25:
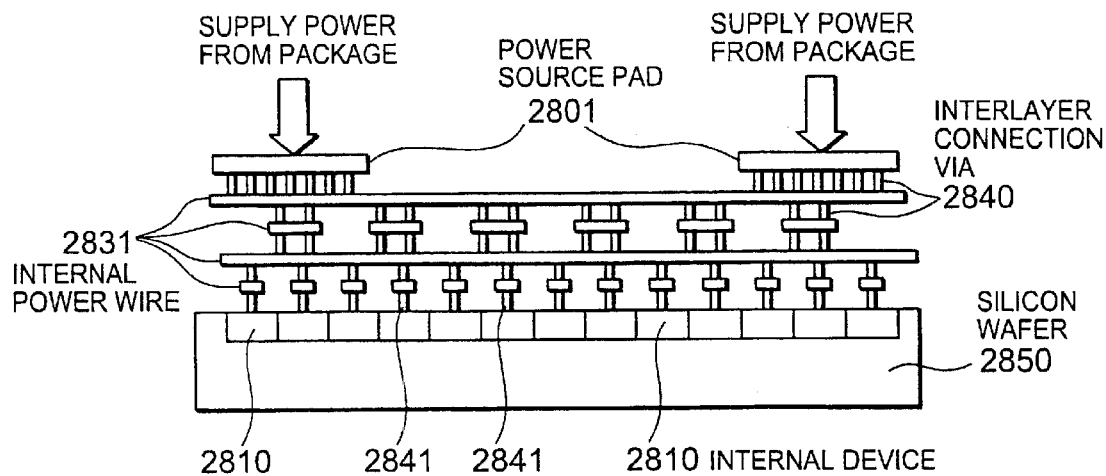
FIG. 24 is a chip cross-sectional view of the prior art semiconductor device.
FIG. 25 is a diagram to compare the effect of the present invention with that of the prior art semiconductor device.

As described above, in the effect of the present invention, the power source wiring is provided between the internal power sources PAD using the present invention, improving the source voltage drop (IR-Drop) by about 9% to 17%, as shown in FIG. 25. In addition, the IR-Drop amount of the VDD and VSS power sources can be balanced.

Although the invention has been described with reference to specific embodiments, this description is not meant to be construed in a limiting sense. Various modifications of the disclosed embodiments will become apparent to persons skilled in the art upon reference to the description of the invention. It is therefore contemplated that the appended claims will cover any modifications or embodiments as fall within the true scope of the invention.

What is claimed is:

1. A semiconductor device having internal power terminals including a positive power terminal supplying a high potential and a negative power terminal supplying a low potential to the internal device region of a semiconductor chip in which said positive power terminal and said negative power terminal are arranged uniformly in the internal device region of said semiconductor chip and power is supplied from the outside of said semiconductor chip to said internal power terminal, wherein a metalizing metal of the same layer as said internal power terminals is wired between said internal power terminals in a tandem shape so as to be connected to the internal power terminal of the same potential, a top and under layer connection VIA is provided in the position where said tandem metalizing metal wire and an under layer metalizing metal cross so as to supply power to the power wire of the internal device region made of said under layer metalizing metal, and only one metalizing metal layer of the same layer as a power source PAD supplying power from a package of the outside of said semiconductor chip to the internal device region of the semiconductor chip is used to lay the internal power wire between said power sources PAD, thereby supplying power to an internal device.

2. The semiconductor device according to claim 1, wherein said power sources PAD of the same potential aligned up and down are wired vertically from the center portion of the top and bottom sides of the power source PAD using a metal of the same layer as the power source PAD, vertically aligning said power sources PAD.

3. The semiconductor device according to claim 1, wherein said power sources PAD of the same potential aligned to right and left are wired horizontally from the center portion of the right and left sides of the power source PAD using a metal of the same layer as the power source PAD, horizontally aligning said power sources PAD.

4. The semiconductor device according to claim 1, wherein said power sources PAD in which said positive power terminal and said negative power terminal are aligned alternately to be laid are wired vertically from the center portion of the top and bottom sides of the power source PAD using a metal of the same layer as the power source PAD, vertically aligning said power sources PAD.

* * * * *